(12) United States Patent
Shih

(10) Patent No.: US 7,623,345 B2
(45) Date of Patent: Nov. 24, 2009

(54) FASTENING STRUCTURE

(75) Inventor: Ying-Hui Shih, Taipei (TW)

(73) Assignee: Lite-On Technology Corp., Taipei (TW)

( * ) Notice: Subject to any disclaimer, the term of this patent is extended or adjusted under 35 U.S.C. 154(b) by 79 days.

(21) Appl. No.: 12/037,071

(22) Filed: Feb. 25, 2008

(65) Prior Publication Data
US 2008/0277547 A1  Nov. 13, 2008

Related U.S. Application Data

(60) Provisional application No. 60/917,071, filed on May 10, 2007.

(51) Int. Cl.
*G06F 1/16* (2006.01)

(52) U.S. Cl. .............. 361/679.58; 361/679.33; 361/679.37; 361/679.39; 248/682; 248/694

(58) Field of Classification Search ........... 361/679.33–679.58; 248/682, 694
See application file for complete search history.

(56) References Cited

U.S. PATENT DOCUMENTS

| | | | | |
|---|---|---|---|---|
| 5,483,419 A | * | 1/1996 | Kaczeus et al. | 361/679.39 |
| 6,325,353 B1 | * | 12/2001 | Jiang | 248/682 |
| 6,490,153 B1 | * | 12/2002 | Casebolt et al. | 361/679.33 |
| 6,637,719 B2 | * | 10/2003 | Jiang | 248/682 |
| 6,854,174 B2 | * | 2/2005 | Jiang | 29/603.1 |
| 2002/0080574 A1 | * | 6/2002 | Jiang | 361/685 |
| 2003/0223192 A1 | * | 12/2003 | Searby et al. | 361/683 |
| 2005/0207108 A1 | * | 9/2005 | Chen | 361/685 |
| 2006/0067042 A1 | * | 3/2006 | Salinas et al. | 361/685 |
| 2007/0053149 A1 | * | 3/2007 | Guo et al. | 361/685 |
| 2007/0064385 A1 | * | 3/2007 | Paul et al. | 361/687 |
| 2007/0076366 A1 | * | 4/2007 | Makabe | 361/685 |
| 2007/0230107 A1 | * | 10/2007 | Hsu et al. | 361/685 |
| 2008/0062635 A1 | * | 3/2008 | Chang | 361/685 |
| 2008/0130219 A1 | * | 6/2008 | Rabinovitz | 361/685 |
| 2008/0285225 A1 | * | 11/2008 | DeMoss et al. | 361/685 |

* cited by examiner

*Primary Examiner*—J. Allen Shriver, II
*Assistant Examiner*—Alaeddin Mohseni
(74) *Attorney, Agent, or Firm*—Kile Goekjian Reed & McManus PLLC

(57) ABSTRACT

A fastening structure for fastening at least a storage component in a computer chassis includes a fixed support frame and at least a fastening apparatus. Additionally, the fastening structure can be utilized to perform a fastening or un-fastening operation with high speed on the storage components in the computer chassis without using any screws. Thus, the disclosed fastening structure can reduce cost of assembly and repair of the computer, and also can reduce time for assembly and repair of the computer.

12 Claims, 8 Drawing Sheets

FASTENING STRUCTURE

CROSS REFERENCE TO RELATED APPLICATIONS

This application claims the benefit of U.S. Provisional Application No. 60/917,071, filed on May 10, 2007 and included herein by reference.

BACKGROUND OF THE INVENTION

1. Field of the Invention

The present invention relates to a fastening structure for fastening at least a computer component, and more particularly, to a fastening structure for fastening at least a storage component in a chassis without using any screws.

2. Description of the Prior Art

Along with recent improvements of semiconductor manufacturing technologies, computers have become an essential part of everyday life. One important area in computer applications for manufacturers and end users is fastening techniques for storage components (such as hard disk drives, floppy disk drives, CD-ROM drives, or DVD-ROM drives) utilized in computer equipment such as personal computers or servers.

In the prior art, the fastening structure for a storage component is a plurality of screws to screw the storage component on a support frame in order to fasten the storage component in a computer chassis. Since the storage component in the computer is usually a replaceable element, however, users frequently fasten or un-fasten the storage component according to using requirements. Thus, using the screws to fasten the storage component causes inconvenience for the user when assembling the computer. For example, the user may need some specific tools for assembly, and the screws will be easily lost when they are removed from the computer chassis. Besides, using the screws to fasten the storage component cannot satisfy the requirements of high speed and low labor cost in the production line. Thus, a fastening structure for performing a fastening or un-fastening operation with high speed on the storage component in a chassis without using any screws is required.

SUMMARY OF THE INVENTION

It is therefore one of the objectives of the present invention to provide a fastening structure for fastening at least a computer component in a chassis without using any screw, to solve the above problems.

According to an embodiment of the present invention, a fastening structure for fastening at least a computer component having at least a first hole disposed thereon is disclosed. The fastening structure includes a fixed support frame and at least a fastening apparatus. The fixed support frame is utilized for supporting the computer component, and has at least a second hole and at least a conjunction part disposed thereon, wherein a position of the second hole corresponds to the first hole. The fastening apparatus includes: a main structure, having at least a first section and a second section; a rotator, disposed in the second section of the main structure in a rotatable way, wherein a position of the conjunction part corresponds to the rotator; and at least a fastening component, disposed in the first section of the main structure, and having at least a first protruding part disposed thereon, wherein a position of the first protruding part corresponds to the second hole and the first hole. When the rotator enters the conjunction part and rotates from an initial position to a predetermined position, the rotator and the conjunction part corresponds to a locked status and lets the first protruding part insert into the second hole and the first hole to fasten the computer component in the fixed support frame.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
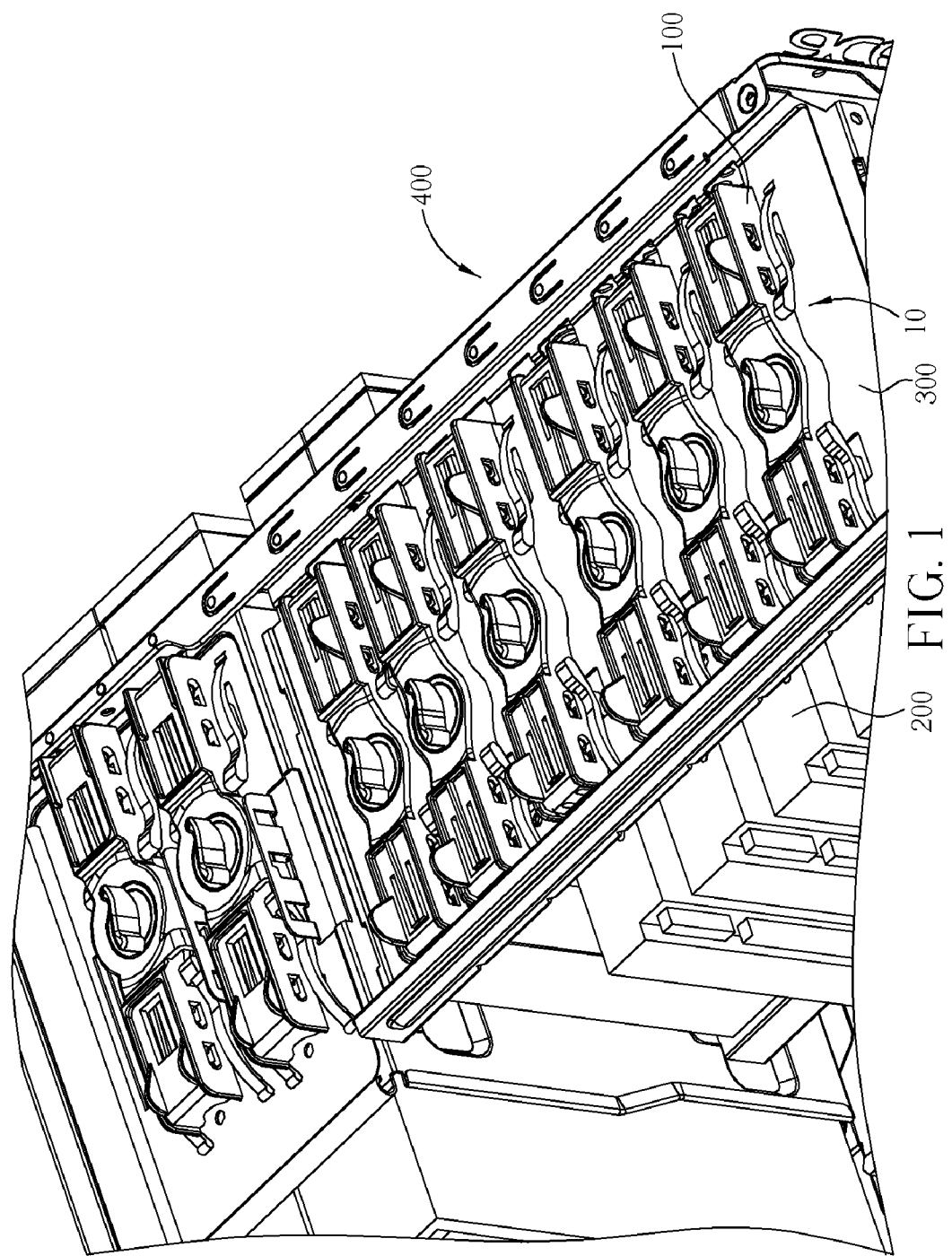
FIG. 1 shows a three-dimensional view of a fastening structure for fastening a plurality of storage components in a computer chassis according to an embodiment of the present invention.
Figure 2:
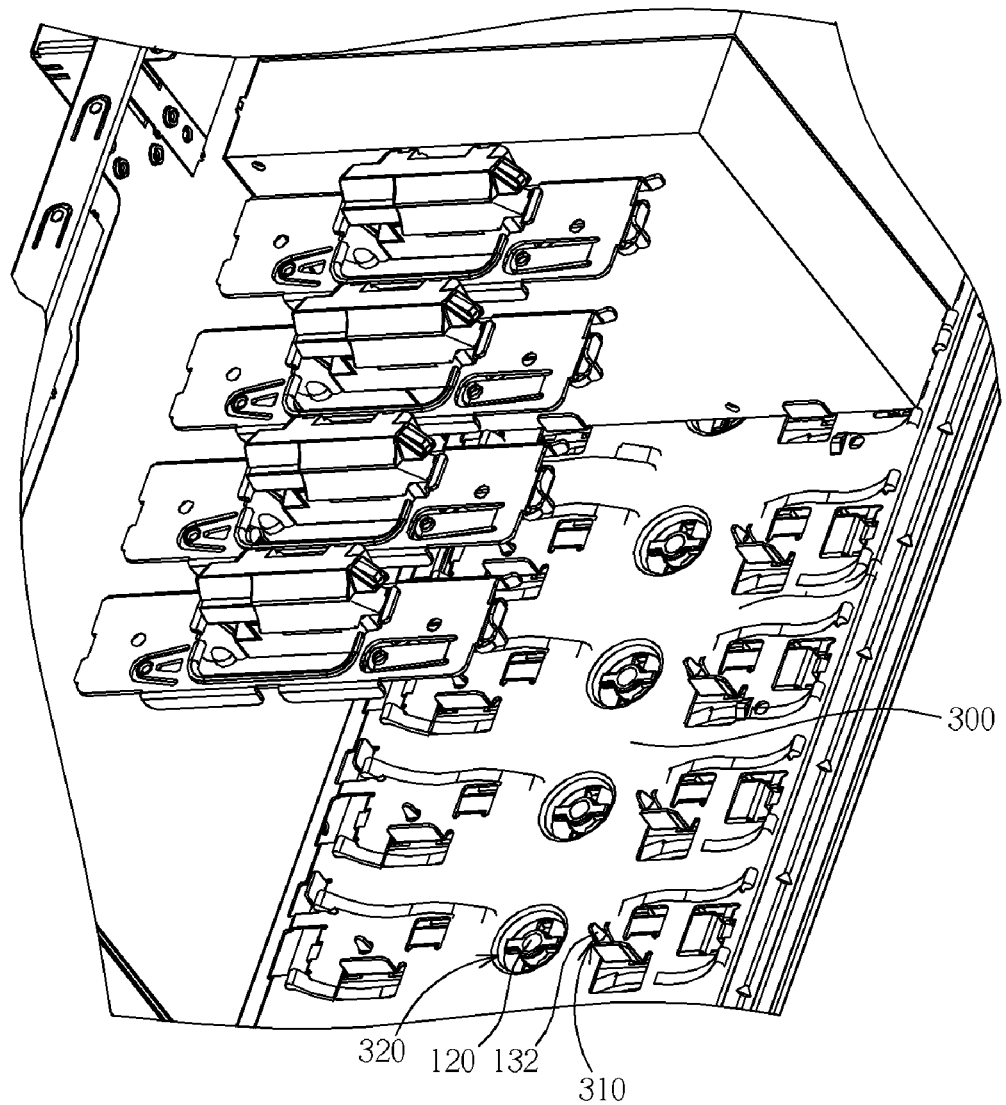
FIG. 2 shows another three-dimensional view of the fastening structure in FIG. 1.
Figure 3:
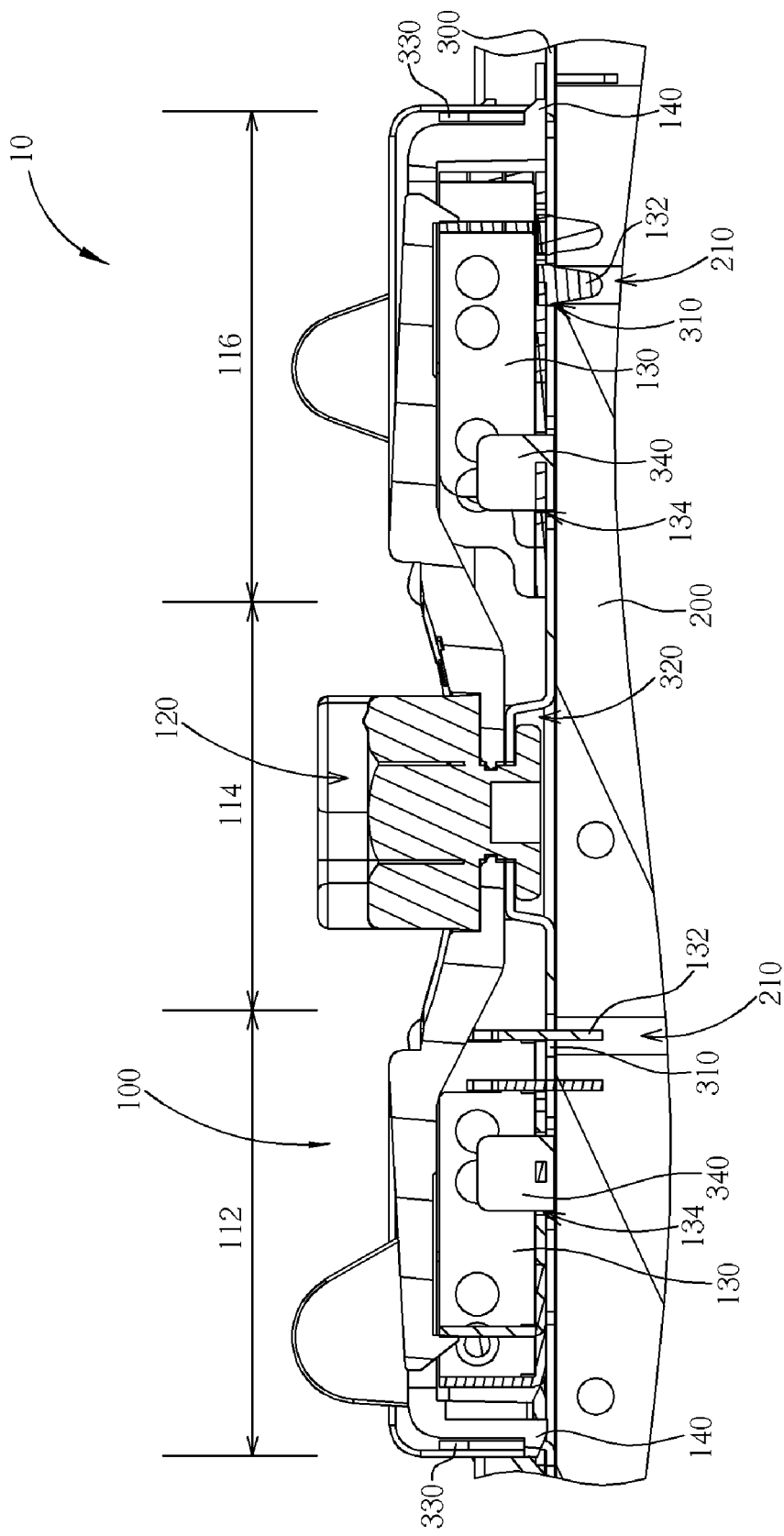
FIG. 3 shows a cross-sectional view of the fastening structure and the storage components in FIG. 2.
Figure 4:
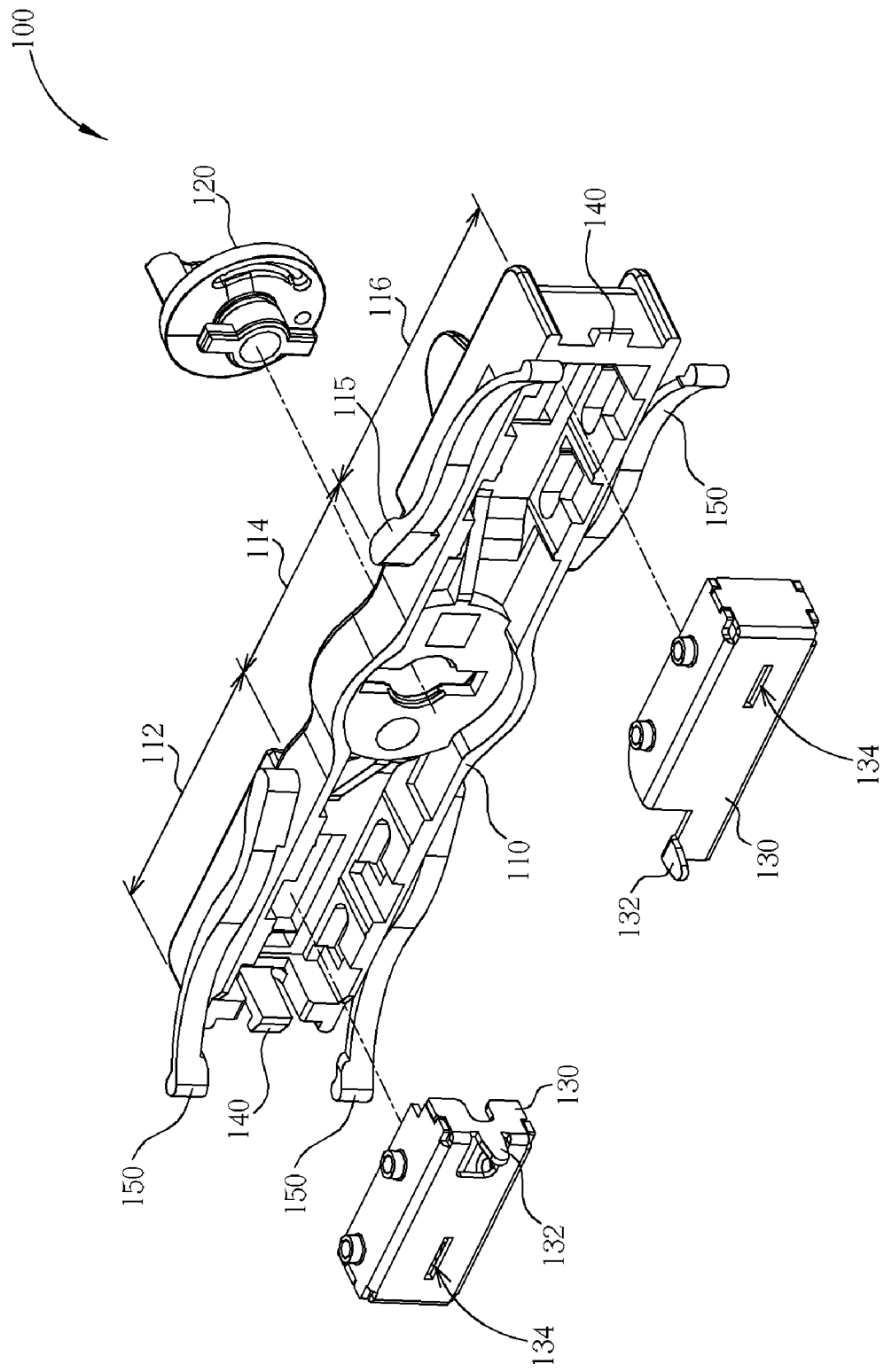
FIG. 4 shows a three-dimensional view of the fastening apparatus in FIG. 1 before assembly.
Figure 5:
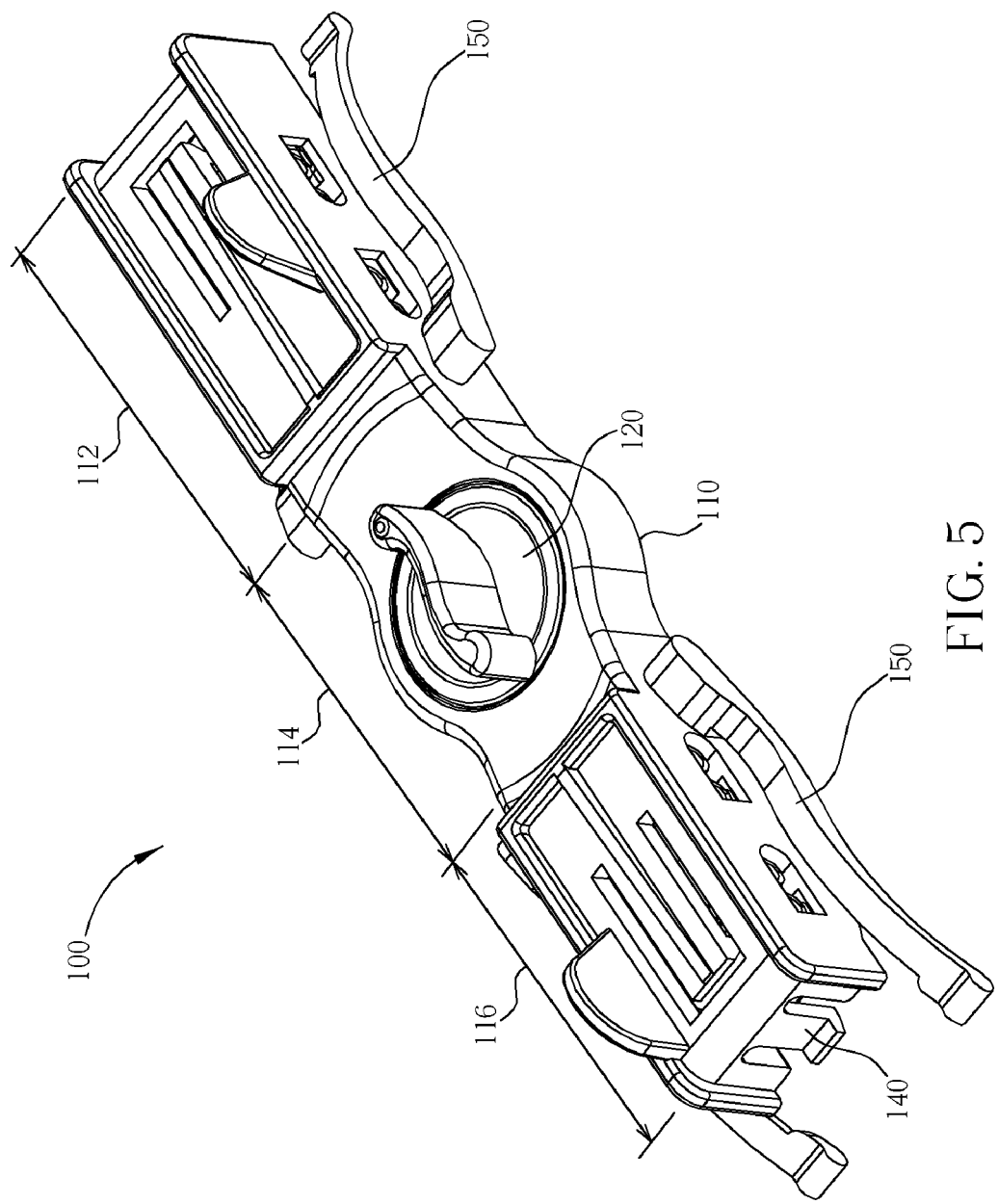
FIG. 5 shows a three-dimensional view of the fastening apparatus in FIG. 4 after assembly.
Figure 6:
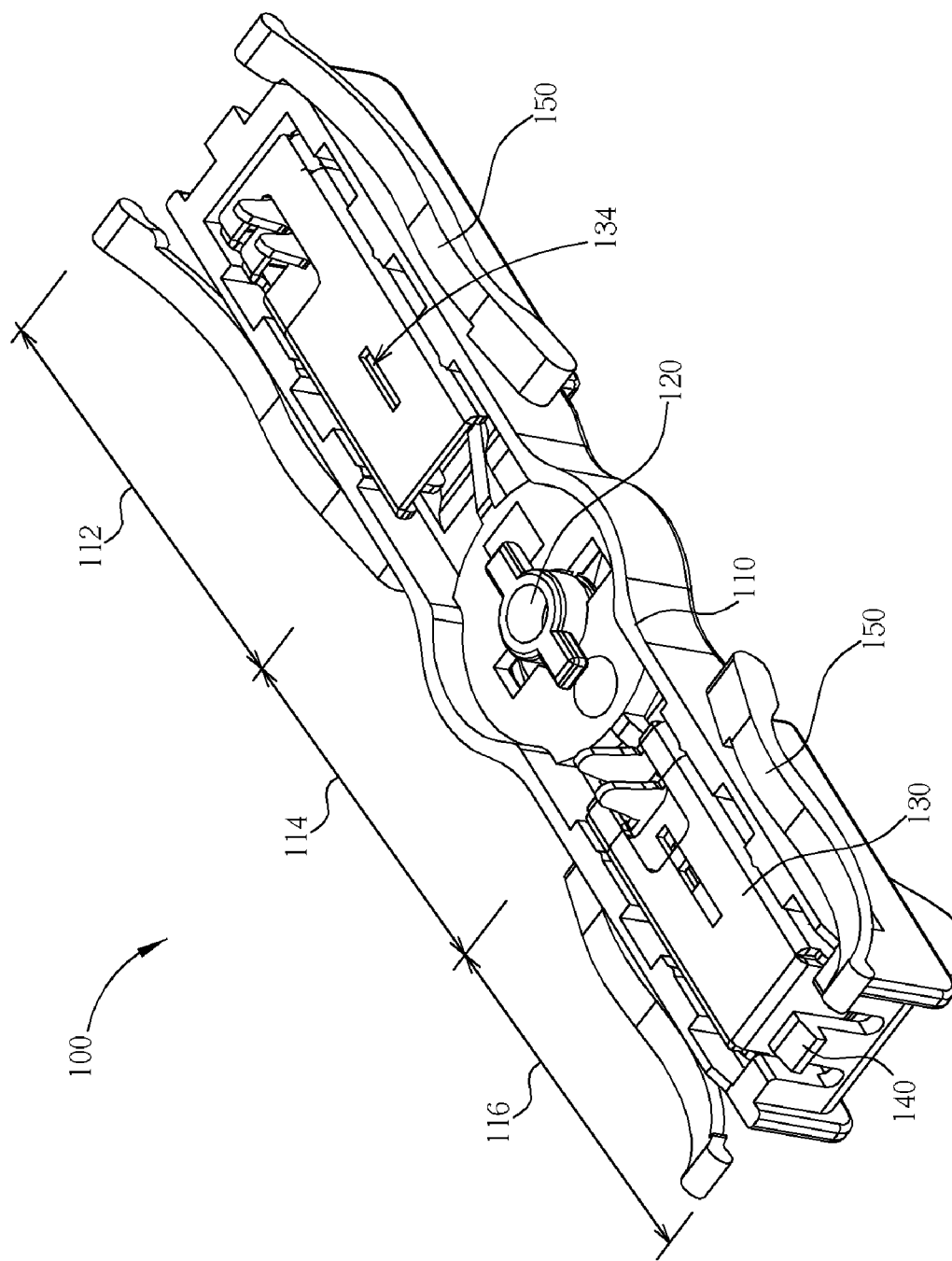
FIG. 6 shows another three-dimensional view of the fastening apparatus in FIG. 4 after assembly.

Please refer to FIG. 1, FIG. 2, and FIG. 3 together. FIG. 1 shows a three-dimensional view of a fastening structure 10 for fastening a plurality of storage components 200 (such as a hard disk drive and a CD-ROM drive) in a computer chassis 400 according to an embodiment of the present invention. FIG. 2 shows another three-dimensional view of the fastening structure 10 in FIG. 1. FIG. 3 shows a cross-sectional view of the fastening structure 10 and the storage components 200 in FIG. 2. The fastening structure 10 includes a fixed support frame 300 and a plurality of fastening apparatuses 100. Next, please refer to FIG. 4, FIG. 5, and FIG. 6 together. FIG. 4 shows a three-dimensional view of the fastening apparatus 100 in FIG. 1 before assembly. FIG. 5 shows a three-dimensional view of the fastening apparatus 100 in FIG. 4 after assembly. FIG. 6 shows another three-dimensional view of the fastening apparatus 100 in FIG. 4 after assembly.

As shown in FIG. 1, FIG. 2, and FIG. 3, the fixed support frame 300 is utilized for supporting the storage component 200. The storage component 200 has a plurality of first holes 210 disposed thereon. The fixed support frame 300 has a plurality of second holes 310, a plurality of conjunction parts 320, a plurality of hooks 330, and a plurality of third protruding parts 340. The position of each second hole 310 corresponds to each first hole 210, and the hooks 330 face the fastening apparatus 100. As shown in FIG. 4, FIG. 5, and FIG. 6, the fastening apparatus 100 includes: a main structure 110 having a first section 112, a second section 114, and a third section 116, wherein the second section 114 is disposed between the first section 112 and the third section 116; a rotator 120 disposed in the second section 114 of the main structure 110 in a rotatable way, wherein position of the conjunction part 320 of the fixed support frame 300 corresponds to the rotator 120; two fastening components 130 disposed in the first section 112 of the main structure 110, and having a first protruding part 132 and a third hole 134 disposed thereon, wherein a position of the first protruding part 132 corresponds to the second hole 310 and the first hole 210; two second protruding parts 140 fixedly connected to the main structure 110, respectively; and four elastic elements 150 disposed on the main structure 110. When the rotator 120 enters the conjunction part 320 and rotates from an initial position to a predetermined position (such as rotating 90 degrees), the rotator 120 and the conjunction part 320 correspond to a locked status and let the first protruding part 132 insert into the second hole 310 and the first hole 210 to fasten the storage component 200 in the fixed support frame 300. The third protruding part 340 on the fixed support frame 300 is utilized for inserting into the third hole 134 to fasten a relative position between the fastening apparatus 100 and the fixed support frame 300. The elastic elements 150 are utilized for providing an elastic force to let the bottom of the fastening apparatus 100 rebound from the surface of the fixed support frame 300 to let the second protruding parts 140 wedge with the hooks 330 when the rotator 120 rotates from the predetermined position to the initial position and converts from the locked status to an unlocked status.

Figure 7:
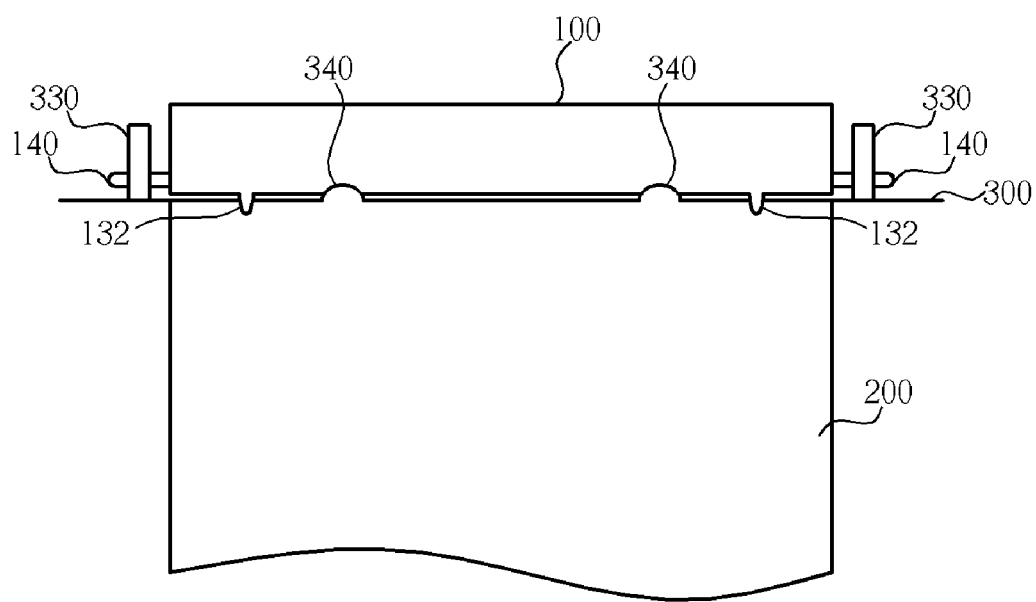
FIG. 7 shows a simplified side view of the fastening apparatus, the storage component, and the fixed support frame.
Figure 8:
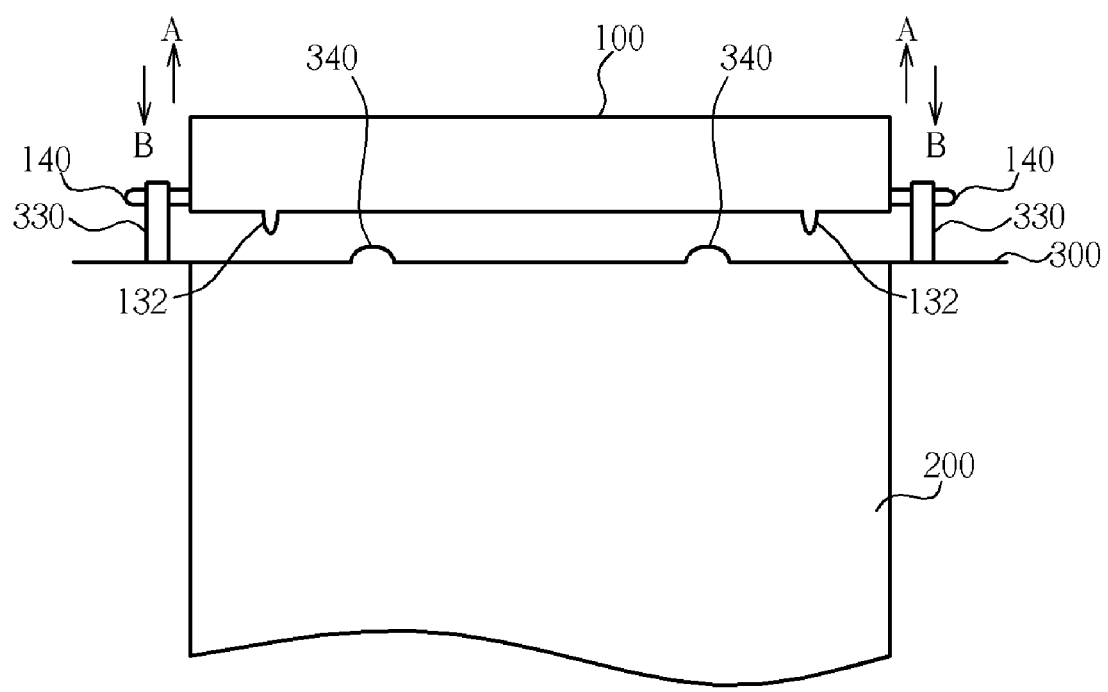
FIG. 8 shows a simplified side view of the fastening apparatus, the storage component, and the fixed support frame.

Please refer to FIG. 7 and FIG. 8. FIG. 7 and FIG. 8 show simplified side views of the fastening apparatus 100, the storage component 200, and the fixed support frame 300. As shown in FIG. 7, when using the fastening apparatus 100 to fasten the storage component 200, the first protruding part 132 fixedly inserts into the second hole 310 and the first hole 210 to fasten the storage component 200 in the fixed support frame 300, and the third protruding part 340 on the fixed support frame 300 inserts into the third hole 134 to fasten a relative position between the fastening apparatus 100 and the fixed support frame 300. As shown in FIG. 7, the elastic elements 150 are utilized for providing an elastic force (arrowhead A in FIG. 8) to let the bottom of the fastening apparatus 100 rebound from the surface of the fixed support frame 300, and the hooks 330 provide a reacting force (arrowhead B in FIG. 8) to wedge the second protruding parts 140 with the hooks 330. Please note that the above embodiment is only for illustrative purposes and is not meant as a limitation of the present invention. For example, the elastic elements 150 can be removed from the fastening apparatus 100 according to different design requirements. The fastening apparatus 100 can still perform a fastening or un-fastening operation with high speed on the storage component 200.

In addition, the fastening structure 10 can be integrated in the computer chassis 300. The materials of the fixed support frame 300 and the fastening component 130 can include various metals, and material of the fastening apparatus 100 and the elastic elements 150 can include plastics and/or various metals. The main structure 110, the elastic elements 150, and the second protruding parts 140 can be formed from a single mold. Please note that the above embodiment is only for illustrative purposes and is not meant as a limitation of the present invention.

Briefly summarized, the disclosed fastening structure can be utilized to perform a fastening or un-fastening operation with high speed on a plurality of interface cards simultaneously in the computer chassis without using any screws. Thus, the disclosed fastening structure can reduce cost of assembly and repair of the computer, and also can reduce time for assembly and repair of the computer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fastening structure for fastening at least a computer component having at least a first hole disposed thereon, the fastening structure comprising:
   a fixed support frame, for supporting the computer component and having at least a second hole and at least a conjunction part disposed thereon, wherein a position of the second hole corresponds to a position of the first hole; and
   at least a fastening apparatus, comprising:
      a main structure, having at least a first section and a second section;
      a rotator, disposed in the second section of the main structure in a rotatable way, wherein a position of the conjunction part corresponds to a position of the rotator; and
      at least a fastening component, disposed in the first section of the main structure and having at least a first protruding part disposed thereon, wherein a position of the first protruding part corresponds to the positions of the second hole and the first hole;
   wherein when the rotator enters the conjunction part and rotates from an initial position to a predetermined position, the rotator and the conjunction part correspond to a locked status and let the first protruding part insert into the second hole and the first hole to fasten the computer component in the fixed support frame.

2. The fastening structure of claim 1, wherein the computer component has a plurality of first holes disposed thereon; the fixed support frame has a plurality of second holes disposed thereon; positions of the second holes respectively correspond to positions of the first holes; the main structure further comprises a third section, and the second section is disposed between the first section and the third section; and the fastening apparatus comprises a plurality of fastening components disposed in the first section and the third section of the main structure, respectively.

3. The fastening structure of claim 1, wherein the fixed support frame further has a plurality of hooks facing the fastening apparatus, and the fastening apparatus further comprises:
   a plurality of second protruding parts, fixedly connected to the main structure, respectively.

4. The fastening structure of claim 3, wherein the fixed support frame further has a plurality of hooks facing the fastening apparatus, and the fastening apparatus further comprises:
   at least an elastic element, disposed on the main structure, for providing an elastic force to let the bottom of the fastening apparatus rebound from a surface of the fixed support frame to let the second protruding parts wedge with the hooks when the rotator rotates from the predetermined position to the initial position and enters an unlocked status from the locked status.

5. The fastening structure of claim 4, wherein a material of the elastic element is selected from a group consisting of plastics and metal.

6. The fastening structure of claim 4, wherein the main structure, the elastic element, and the second protruding parts are formed from a single mold.

7. The fastening structure of claim 1, wherein the fastening component further has at least a third hole disposed thereon, and the fixed support frame further has at least a third protruding part disposed thereon, for inserting into the third hole to fasten a relative position between the fastening apparatus and the fixed support frame.

8. The fastening structure of claim 1, being integrated in a chassis.

9. The fastening structure of claim 1, wherein the computer component is a storage component.

10. The fastening structure of claim 9, wherein the storage component is a hard disk drive, a floppy disk drive, or an optical disc drive.

11. The fastening structure of claim 1, wherein materials of the fixed support frame and the fastening component comprise metal.

12. The fastening structure of claim 1, wherein material of the fastening apparatus is selected from a group consisting of plastics and metal.

\* \* \* \* \*